United States Patent
Mise et al.

(10) Patent No.: US 7,671,426 B2
(45) Date of Patent: Mar. 2, 2010

(54) METAL INSULATOR SEMICONDUCTOR TRANSISTOR USING A GATE INSULATOR INCLUDING A HIGH DIELECTRIC CONSTANT FILM

(75) Inventors: Nobuyuki Mise, Tokyo (JP); Akira Toriumi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/320,988

(22) Filed: Feb. 10, 2009

(65) Prior Publication Data

US 2009/0173998 A1     Jul. 9, 2009

Related U.S. Application Data

(62) Division of application No. 11/702,104, filed on Feb. 5, 2007, now Pat. No. 7,507,632.

(30) Foreign Application Priority Data

Feb. 6, 2006 (JP) ............................. 2006-027879

(51) Int. Cl.
*H01L 29/76* (2006.01)
*H01L 29/94* (2006.01)

(52) U.S. Cl. ................... 257/410; 257/411; 257/E27.06

(58) Field of Classification Search ................. 257/410, 257/411, E27.06
See application file for complete search history.

(56) References Cited

U.S. PATENT DOCUMENTS

| | | | | |
|---|---|---|---|---|
| 6,063,698 A | * | 5/2000 | Tseng et al. | 438/585 |
| 6,784,515 B1 | * | 8/2004 | Li | 257/510 |
| 6,838,363 B2 | * | 1/2005 | Wieczorek et al. | 438/528 |
| 2005/0101147 A1 | | 5/2005 | Labelle et al. | |
| 2006/0027882 A1 | * | 2/2006 | Mokhlesi | 257/410 |
| 2007/0296039 A1 | * | 12/2007 | Chidambarrao et al. | 257/355 |
| 2008/0124907 A1 | * | 5/2008 | Forbes et al. | 438/587 |

* cited by examiner

*Primary Examiner*—Ngan Ngo
(74) *Attorney, Agent, or Firm*—Stites & Harbison PLLC; Juan Carlos A. Marquez, Esq.

(57) ABSTRACT

In a MIS transistor of which gate length is 10 nm or less, a gate insulator comprising a silicon oxide film formed on a silicon substrate and a high-k film formed on the silicon oxide film has a nitrided region including more nitrogen at the lateral side than at the central side in the gate-length direction, and including more nitrogen at the upper side than at the lower side in the film thickness direction. The reliability and characteristics of a MIS transistor using a gate insulator including a high-k (high dielectric constant) film is enhanced.

8 Claims, 12 Drawing Sheets

METAL INSULATOR SEMICONDUCTOR TRANSISTOR USING A GATE INSULATOR INCLUDING A HIGH DIELECTRIC CONSTANT FILM

CROSS-REFERENCE TO RELATED APPLICATION

This application is a Divisional of U.S. Ser. No. 11/702,104 filed Feb. 5, 2007. Priority is claimed based on U.S. Ser. No. 11/702,104 filed on Feb. 5, 2007, now U.S. Pat. No. 7,507,632 which claims priority to Japanese Patent Application No. 2006-27879 filed on Feb. 6, 2006, the content of which is hereby incorporated by reference into this application.

TECHNICAL FIELD OF THE INVENTION

The present invention relates to a semiconductor device and a manufacturing technique thereof. More particularly, the present invention relates to a technique effectively applied to a semiconductor device having a MIS (Metal Insulator Semiconductor) transistor using a gate insulator including a high-k film (high dielectric constant film).

BACKGROUND OF THE INVENTION

Recently, as MIS transistors which form semiconductor integrated circuits have been scaled, gate insulator thereof has become rapidly thinner. Consequently, influences of depletion in the gate electrode (polycrystalline silicon film) near the interfaces between the gate electrode and gate insulator caused when gate voltage is applied to a gate electrode to turn on a MIS transistor become more and more apparent. As a result, apparent thickness of the gate insulator becomes thicker, which makes it difficult to have sufficient ON current, and operation speed of the transistor is significantly reduced. Also, when the gate insulator becomes thinner, since a quantum effect called direct tunneling occurs, which makes electrons pass through the gate insulator, the leakage current is increased. For its solution, using materials having high permittivity for gate insulator is studied. For example, an insulating film having higher permittivity obtained by adding nitride to a silicon oxide film so that its nitride concentration becomes higher, and a high dielectric film which is so-called high-k film. As materials of the high-k film, hafnium oxide ($HfO_x$) having a relative dielectric constant of about 20 to 25, materials having higher crystallization temperature obtained by combining this hafnium oxide with silicon (Si) or aluminum (Al) ($HfAlO_x$, $HfSiO_x$), and rare-earth oxides (such as $La_2O_3$, $Y_2O_3$) are promising.

When using such high dielectric constant film for the gate insulator, even the EOT (equivalent silicon oxide thickness) is the same, the actual physical thickness can be increased by a factor of "dielectric constant of a high dielectric constant film/dielectric constant of a silicon oxide film". As a result, ensuring capacitance of the gate insulator, the leakage current can be reduced.

For example, in Japanese Patent Application Laid-Open Publication No. 7-030113 (Patent Document 1), a technique to obtain nitride of several atom percents near interface between gate insulator and semiconductor substrate except at the center portion in the channel direction under the gate insulator is disclosed.

Also, in Japanese Patent Application Laid-Open Publication No. 2002-26317, a technique to form a high-concentration nitride region at the interface between the substrate under the end portion of the gate electrode and gate insulator.

Also, in Japanese Patent Application Laid-Open Publication No. 2003-249649, a technique to introduce nitride near the both sides of the insulator.

Also, in OYO BUTSURI Vol. 72, Number 9 (2003), p. 1136-p. 1142 (Non-patent Document), a technique relates to a FinFET having a channel made to have a three-dimensional structure (Fin structure) to suppress short-channel effect.

SUMMARY OF THE INVENTION

The inventors are studying about a semiconductor device having a metal insulator semiconductor (MIS) transistor using a gate insulator made of a high-k material such as $HfO_x$, $HfAlO_x$, $HfSiO_x$, $La_2O_3$, and $Y_2O_3$. As a result, if the MIS transistor is formed merely to be thinner, that is, by shortening the gate length only, the following problems are found.

Figure 18:
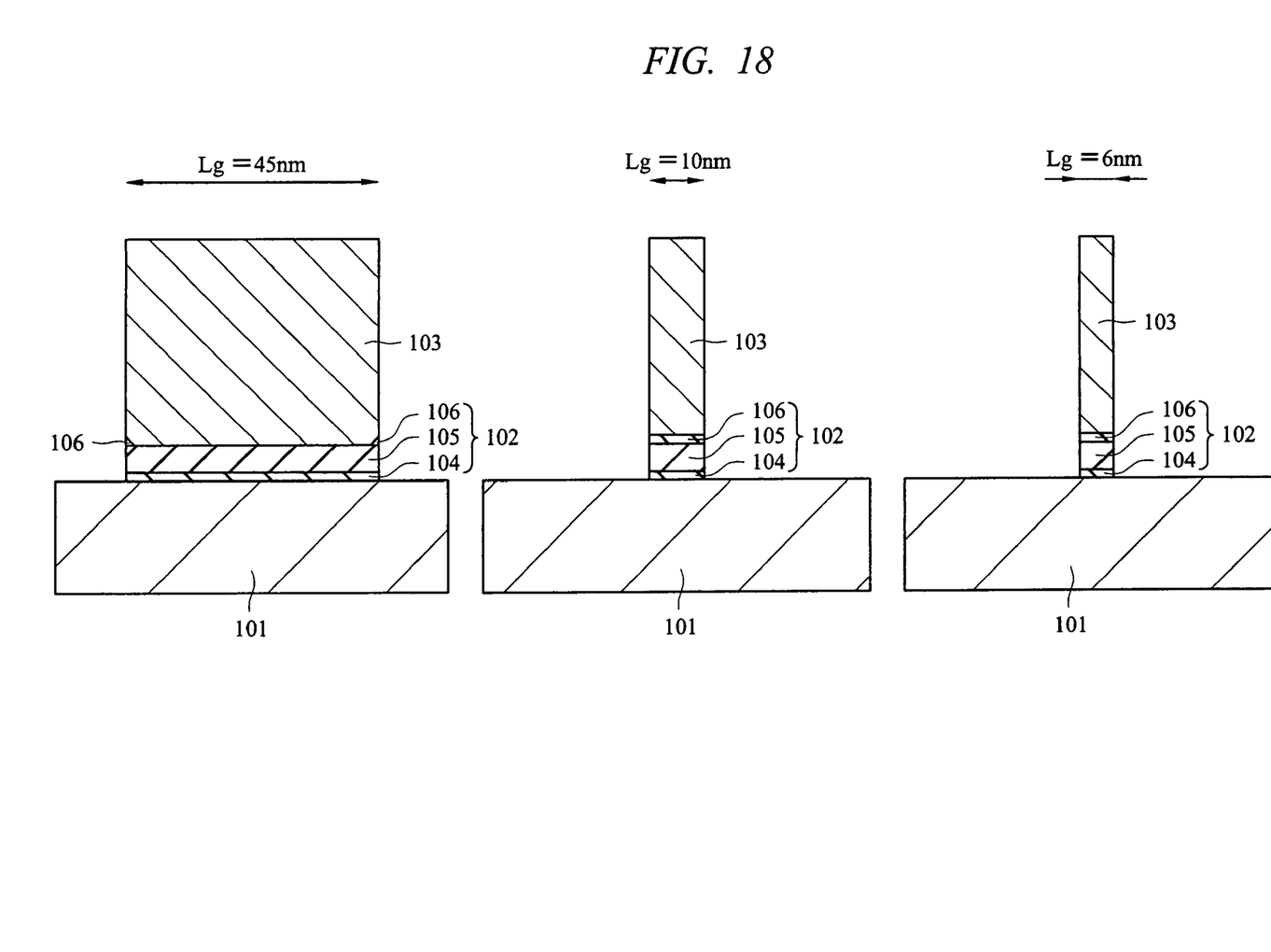
FIG. 18 is a schematic sectional view of main parts of a semiconductor device investigated by the inventors.

FIG. 18 is a schematic sectional view of main parts of semiconductor device investigated by the inventors, and FIG. 18 shows the MIS transistors of which gate length Lg is 45 nm, 10 nm, and 6 nm. FIG. 18 shows the MIS structure of gate insulator 102 and gate electrode 103 formed on a silicon-on-insulator (SOI) layer 101.

The forming step of MIS structure of semiconductor device investigated by the inventors is briefly explained with reference to FIG. 18. Materials for forming gate insulator 102 and gate electrode 103 are sequentially laminated on the main surface of silicon substrate having the SOI layer 101, and the MIS structure as shown in FIG. 18 can be formed by gate processing. The gate insulator 102 of this MIS structure is composed of a silicon oxide film 104 such as $SiO_2$, a high-k film 105 such as $HfAlO_x$, and an oxide film 106 mainly containing SiO. The gate electrode 103 is made of, for example, nickel silicide (NiSi).

Among the insulators for composing the gate insulator 102, the oxide film 106 is process-induced, and is not required in the gate insulator 102 desired by the inventors. That is, the presence of this oxide film 106 may lead to an increase of equivalent silicon oxide thickness (EOT) of the gate insulator 102, or may have adverse effects on the threshold value, other characteristics or reliability of MIS transistor. On the high-k film, such oxide film 106 may be formed in a process of even about 600.degree. C.

On the other hand, the silicon oxide film 104 is used for assuring a high mobility as compared with a case of forming the high-k film 105 directly on the SOI layer 101, and the high-k film 105 is used for reducing the EOT as stated above, and for increasing the physical film thickness so as to prevent increase of leakage current due to direct tunnel phenomenon.

As shown in FIG. 18, the oxide film 106 exists only at both ends between the high-k film 105 and gate electrode 103 when the gate length Lg is about 45 nm, and exists on the whole surface between the high-k film 105 and gate electrode 103 when the gate length Lg is about 10 nm or less. Therefore, when the gate length Lg is about 45 nm, influences of oxide film 106 on the gate insulator 102 are small, but when the gate length Lg is about 10 nm or less, the EOT of the gate insulator 102 is increased, and threshold values and other characteristics of the MIS transistor deteriorate, and further, reliability of the MIS transistor is lowered.

To realize an EOT of 0.5 nm or less, when $La_2O_3$ or $Y_2O_3$ or other rare-earth oxide is used as high-k film, since the rare-earth oxide is likely to absorb moisture, reliability and characteristics of MIS transistor are lowered.

Besides, since the rare-earth oxide is likely to absorb moisture, wet process on rare-earth oxide is difficult.

Note that, when forming a MIS transistor having a gate insulator including high-k film, especially a MIS transistor having a gate length Lg of 10 nm or less, the above problems cannot be solved by the following technology.

As disclosed in Patent Document 1 (Japanese Patent Application Laid-Open Publication No. 7-330113), if annealed in furnace at high temperature of 950.degree. C., a thick oxide film is formed at the upper and lower interface of gate insulator, and the EOT is increased.

As disclosed in Patent Document 2 (Japanese Patent Application Laid-Open Publication No. 2002-26317), when heated at high temperature of 800.degree. C., a thick oxide film is formed at the upper and lower interface of gate insulator, and the EOT is increased, and also a nitrided region of high concentration is formed at the interface of silicon substrate and gate insulator, and mobility of MIS transistor is lowered.

As disclosed in Patent Document 3 (Japanese Patent Application Laid-Open Publication No. 2003-249649), when the gate insulator is nitrided after patterning the gate, a nitrided region of high concentration is formed in part of the interface of silicon substrate and gate insulator, and the mobility of MIS transistor is lowered.

It is hence an object of the present invention is to present a technology capable of enhancing the reliability and characteristics of the MIS transistor by using a gate insulator including a high-k film.

The above and other objects and novel characteristics of the present invention will be apparent from the description of this specification and the accompanying drawings.

The typical ones of the inventions disclosed in this application will be briefly described as follows.

In the present invention, the gate insulator including a silicon oxide film formed on a silicon substrate and a high-k film formed on the silicon oxide film contains more nitrogen at the lateral side than at the central portion in the gate length direction, and contains more nitrogen at the upper side than at the lower side in the film thickness direction.

The effects obtained by typical aspects of the present invention will be briefly described below.

The invention improves reliability and characteristics of a MIS transistor using a gate insulator formed by high-k material.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Embodiment 1

As an example of a semiconductor device of the present invention, an Embodiment 1 relates to a semiconductor device having a MIS (Metal Insulator Semiconductor) transistor.

Figure 1:
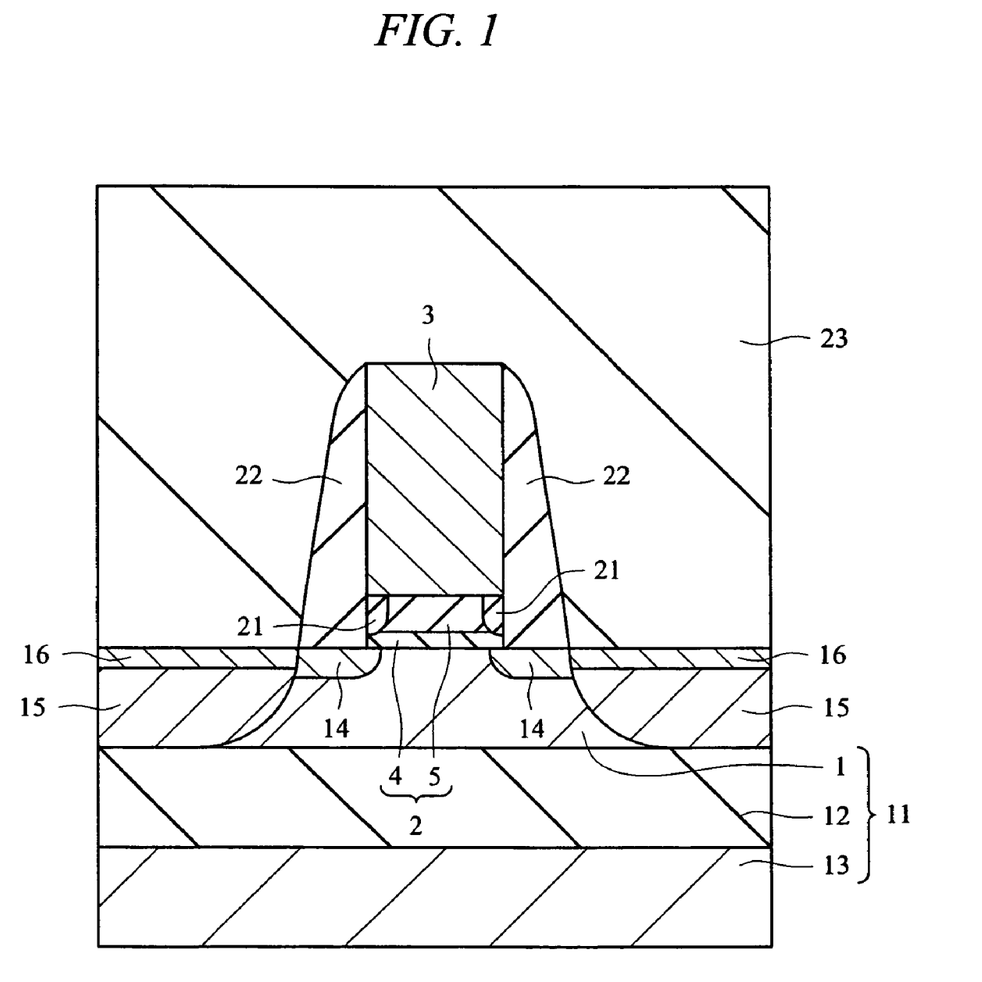
FIG. 1 is a schematic sectional view of main parts of semiconductor device having MIS transistor of an Embodiment 1.
Figure 2:
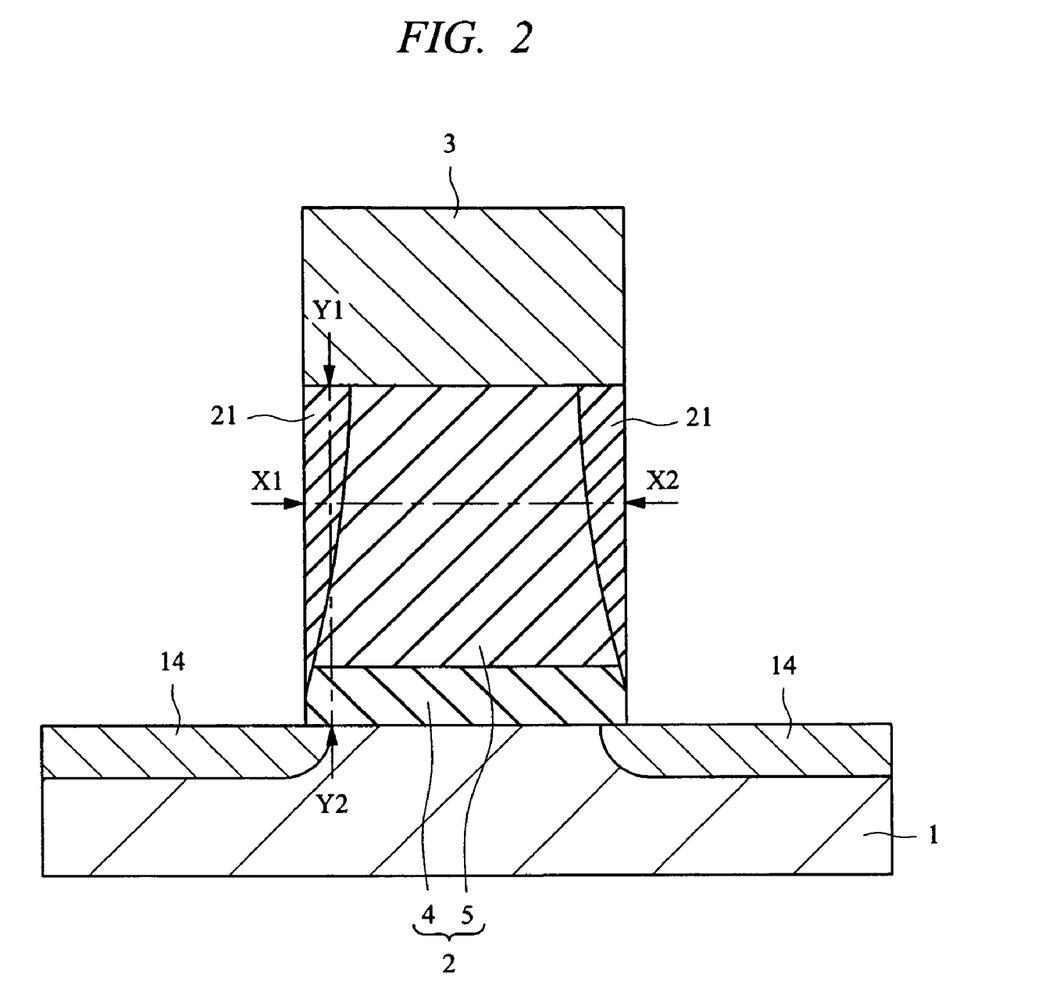
FIG. 2 is a schematic enlarged sectional view of main parts of MIS transistor in FIG. 1.

FIG. 1 is a schematic sectional view of main parts of a semiconductor device having a MIS transistor of the present Embodiment 1. FIG. 2 is a schematic enlarged sectional view of main parts of the MIS transistor in FIG. 1. As shown in FIG. 1 and FIG. 2, the MIS transistor has a MIS structure formed by an SOI (Silicon on Insulator) layer 1, a gate insulator 2, and a gate electrode 3. For example, the gate length of the MIS transistor is about 10 nm, the EOT of the gate insulator 2 is about 0.5 nm, and the thickness of SOI layer 1 is about 5 nm. In the Embodiment 1, the gate length is supposed to be about 10 nm, but it is applicable if the gate length is 10 nm or less.

The SOI layer 1 is an upper semiconductor layer isolated and separated from a lower supporting substrate 13 by means of a buried oxide (BOX) layer 12 formed in a silicon substrate 11. On this SOI layer 1, low-concentration semiconductor region 14 and high-concentration semiconductor region 15 are formed as a source and drain of the MIS transistor. At the surface side of the high-concentration semiconductor region 15, silicide 16 of, for example, nickel silicide (NiSi) is formed, and is electrically connected to an upper metal wiring layer through a plug not shown.

The gate electrode 3 is a conductive film of, for example, nickel silicide (NiSi), and forms a so-called metal gate. A sidewall 22 is formed at the lateral side of the gate electrode 3, and an interlayer insulator 23 is formed on the silicon substrate 11 so as to cover the gate electrode 3 and sidewall 22.

The gate insulator 2 includes a silicon oxide layer 4 and a high-k film 5. In the Embodiment 1, the silicon oxide film 4 is, for example, an $SiO_2$ film having a film thickness of about 0.3 nm. The high-k film 5 is, for example, an oxide containing hafnium. A hafnium oxide ($HfO_x$) having a dielectric constant of about 20 to 25 may be adopted. This hafnium oxide may be further added with silicon (Si) or aluminum (Al), and materials enhanced in crystallization temperature may also be used ($HfAlO_x$, $HfSiO_x$).

In the gate insulator 2, a nitrided region (nitrogen region) 21 not contacting with the SOI layer 1 may be formed at both ends (source and drain ends) with a thickness (depth) of about 1 nm or less from the both ends. The structure of the gate insulator 2 is a stacked structure having the silicon oxide layer 4 and high-k layer 5 formed sequentially on the SOI layer 1. Accordingly, the nitrided region 21 is mainly formed at both ends of the high-k film 5 and nitrogen is not contained at the SOI layer 1 side of the gate insulator 2. Note that, although not shown, a high-k film having higher dielectric constant than the high-k film 5 may be formed between the gate electrode 3 and the high-k film 5 so that a process-induced low-k film may not be formed.

Figure 3:
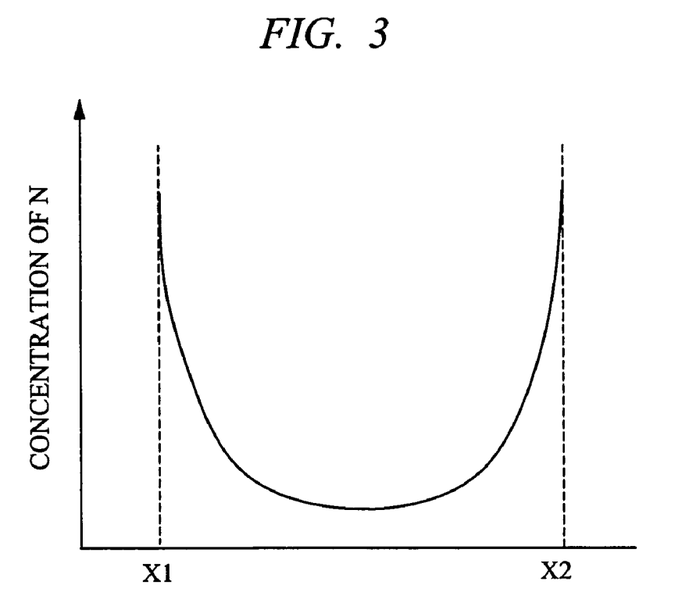
FIG. 3 is an explanatory diagram of an example of nitrogen concentration distribution along line X1-X2 in FIG. 2.
Figure 4:
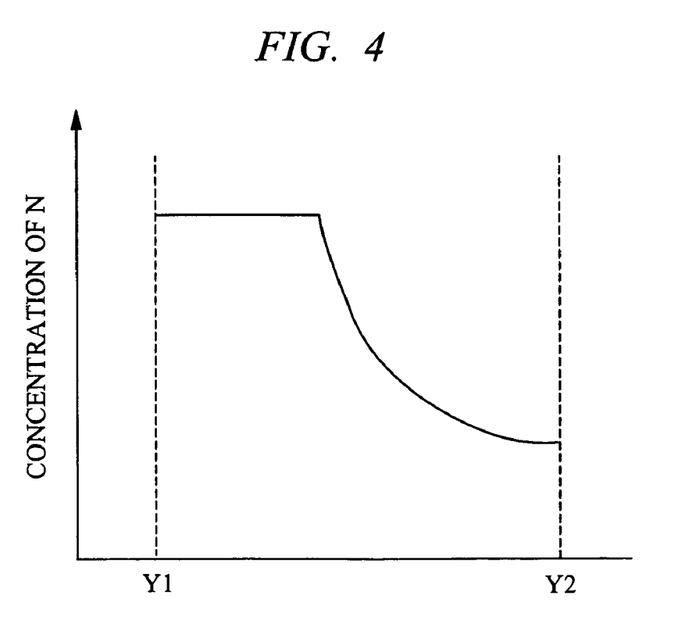
FIG. 4 is an explanatory diagram of an example of nitrogen concentration distribution along line Y1-Y2 in FIG. 2.

The nitrided region 21 is formed by the gate insulator 2 including nitrogen distributed with a gradient. FIG. 3 is an explanatory diagram of an example of a nitrogen concentration distribution along line X1-X2 in FIG. 2, that is, in the gate length direction of the gate electrode 2. FIG. 4 is an explanatory diagram of an example of nitrogen concentration distribution along Y1-Y2 line in FIG. 2, that is, in the film thickness direction of the gate electrode 2.

The gate insulator 2 of the present invention contains, as shown in FIG. 3, more nitrogen at the lateral sides (X1 and X2 sides) than at the central side in the gate length direction, and, as shown in FIG. 4, contains more nitrogen at the gate electrode 3 side (Y1 side) than at the SOI layer 1 side (Y2 side) in the film thickness direction. Since the gate insulator 2 has such nitrided region 21, formation of the oxide film 106 as shown in FIG. 18 can be prevented. That is, in the semiconductor device shown in FIG. 18, a trap is likely to occur in the interface of oxide film 106 and high-k film 105, and especially it becomes a trap site of hot carrier formed at drain end to lead to deterioration of reliability of the MIS transistor, however, by preventing generation of such oxide film 106, reliability of the MIS transistor can be enhanced.

Here, differences from the semiconductor device disclosed in Japanese Patent Application Laid-Open Publication No. 2003-249649 (Patent Document 3) is explained. In the semiconductor device of the present invention, at both ends of the high-k film 5, aside from the gradient of nitrogen concentration (see FIG. 3) in gate length direction, there is also a gradient of nitrogen concentration (see FIG. 4) in the film thickness direction, and at the interface with the SOI layer 1 (Y2 in FIG. 4), the nitrogen concentration is similar to that before nitridation process. Further, even at both ends of the high-k film 5, the nitrogen concentration is not so high near the SOI layer 1 interface.

Besides, in the semiconductor device of Patent Document 3, since the gate insulator is nitrided after exposing the source and drain, the source and drain are also nitrided. However, in the semiconductor device of the present invention, the gate insulator is nitrided with the gate insulator being present on the source and drain, and then the source and drain are exposed, so that the source and drain are not nitrided.

The invention relates to the MIS transistor of which the gate length is 10 nm or less, and in Patent Document 3, if the width (depth, thickness) in the gate length direction (lateral direction) of nitrided region (high-concentration region) is about 5 nm, the entire gate insulator is nitrided at high concentration. In the present invention, on the other hand, the thickness (depth) of the nitrided region is about 1 nm, and it is sufficient.

As described above, the semiconductor device of the present invention is different from the semiconductor device of Patent Document 3. In the semiconductor device of the present invention, moreover, by forming such nitrided region 21, the characteristics of the MIS transistor can be enhanced unlike the semiconductor device of Patent Document 3. The effects are more specifically described below with reference to FIG. 5 and FIG. 6.

Figure 5A:
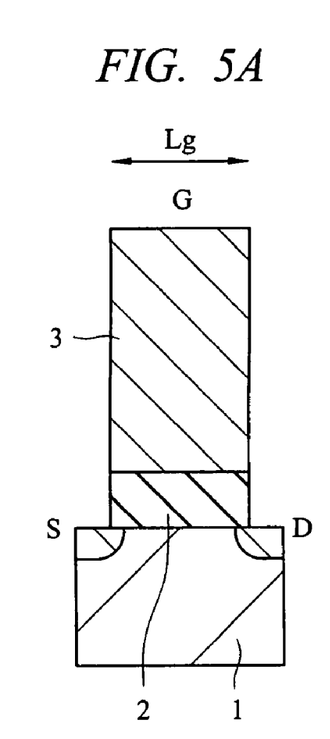
FIG. 5A is a sectional view explaining a MIS transistor having a nitrided region of high nitrogen concentration at the lateral side from the central side of the gate insulator without nitrided region.
Figure 5B:
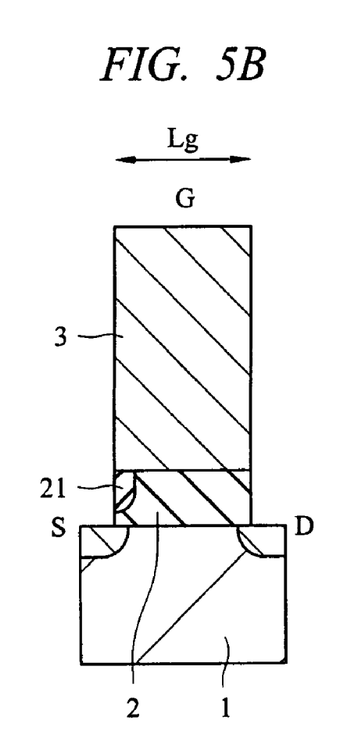
FIG. 5B is a sectional view explaining the MIS transistor having a nitrided region of high nitrogen concentration at the lateral side from the central side of the gate insulator, having the nitrided region only at source end.
Figure 5C:
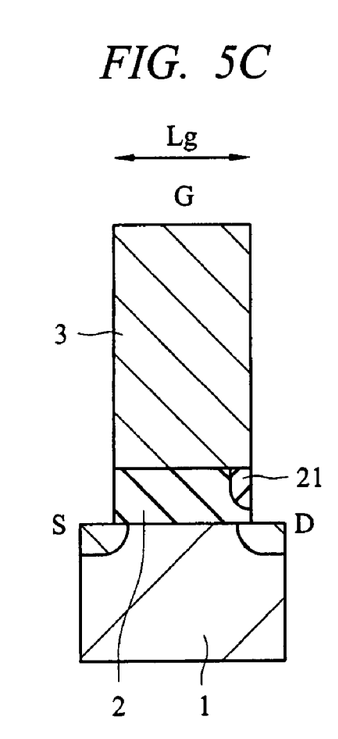
FIG. 5C is a sectional view explaining the MIS transistor having a nitrided region of high nitrogen concentration at the lateral side from the central side of the gate insulator, having the nitrided region only at drain end.
Figure 5D:
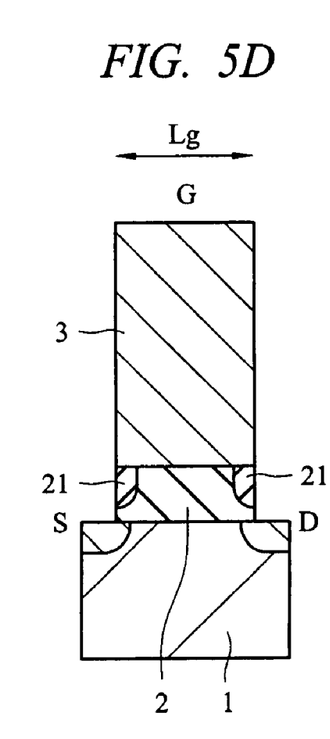
FIG. 5D is a sectional view explaining the MIS transistor having a nitrided region of high nitrogen concentration at the lateral side from the central side of the gate insulator, having the nitrided region both at source end and at drain end.
Figure 6:
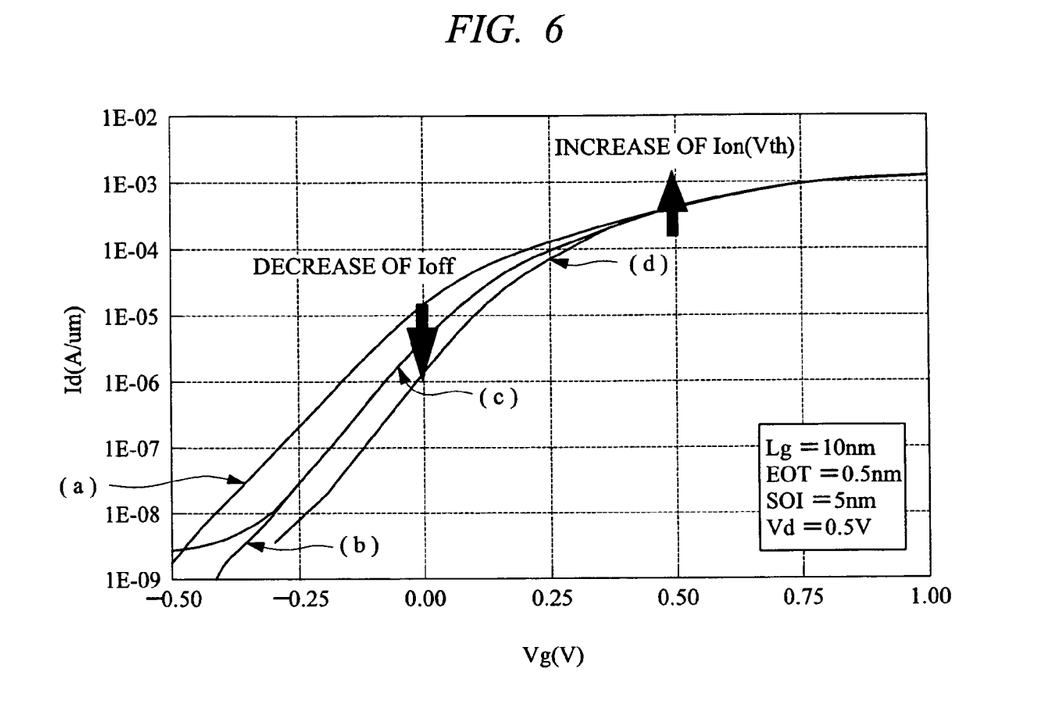
FIG. 6 is an explanatory diagram of a drain current characteristic of respective MIS transistors shown in FIG. 5A to FIG. 5D.

FIG. 5 is a sectional view explaining the MIS transistor having a nitrided region of high nitrogen concentration at the lateral side from the central side of the gate insulator, in which FIG. 5A shows the MIS transistor not having a nitrided region, FIG. 5B shows the MIS transistor having a nitrided region only at source end, FIG. 5C shows the MIS transistor having a nitrided region only at drain end, and FIG. 5D shows the MIS transistor having nitrided regions at both source end and drain end. FIG. 6 is an explanatory diagram of a drain current characteristic (solid line) of MIS transistors A to D shown in FIG. 5 respectively.

In FIG. 5, in MIS transistors B to D, width of the nitrided region 21 in the gate length Lg direction is about 1 nm each, and the EOT of the gate insulator 2 of the nitrided region 21 is about 0.1 nm. As common conditions of the MIS transistors A to D, gate length is about 10 nm, EOT of the gate insulator 2 is about 0.5 nm, and thickness of SOI layer 1 is about 5 nm. The high concentration nitrided region is a region of about 1 nm at the source end or drain end, and its EOT is defined to be about 0.1 nm.

As shown in FIG. 6, the MIS transistor characteristics are demanded to have an increase in drain current Id in ON state, and a decrease in drain current Id in OFF state. That is, the on/off current ratio of the MIS transistor is demanded to be larger. Further, if the drain current Id can be decreased in OFF state (for example, Vg=0 V), the power consumption can be much more saved.

In MIS transistors A to D shown in FIG. 5A to FIG. 5D, as shown in FIG. 6, the drain current characteristics in ON state are similar. On the other hand, as compared with the MIS transistor A not having nitrided region in the gate insulator 2, the drain current Id in OFF state is decreased for the MIS transistors having nitrided region 21. Further, in the MIS transistor D having a nitrided region at both source (S) end and drain (D) end, the drain current Id in OFF state is much decreased. Therefore, when the gate insulator 2 has such nitrided region 21, the MIS transistor characteristics can be enhanced.

Thus, by forming the nitrided region 21 at both source end and drain end, the semiconductor device having the MIS transistor of the present invention brings about the following effects. First, at the source end and drain end of the gate insulator 2, since the EOT is thinner, short channel effect can be suppressed, and therefore the on/off current ratio of the MIS transistor can be increased.

Moreover, since the nitrogen concentration is low in the middle of the gate insulator 2, the mobility is kept high beneath the center, and therefore the drain current Id can be increased.

As described above, since the oxygen diffusing in manufacturing process is blocked by the nitrided region 21 formed at the end (exposed side) of the gate insulator 2, an oxide film is not formed between high-k film and gate electrode 3. That is, a process-induced oxide film is not formed, and by suppressing EOT increase, short channel effect can be suppressed, so that the on/off current ratio of the MIS transistor can be increased.

Therefore, according to the present invention, the MIS transistor using the gate insulator formed by a high-k material can be improved in reliability and characteristics.

Next, an example of a manufacturing method of the semiconductor device according to the present Embodiment 1 is described with reference to FIG. 7 to FIG. 12. FIG. 7 to FIG. 12 are schematic sectional views of main parts of the semiconductor device in the process of manufacturing in the present Embodiment 1.

Figure 7:
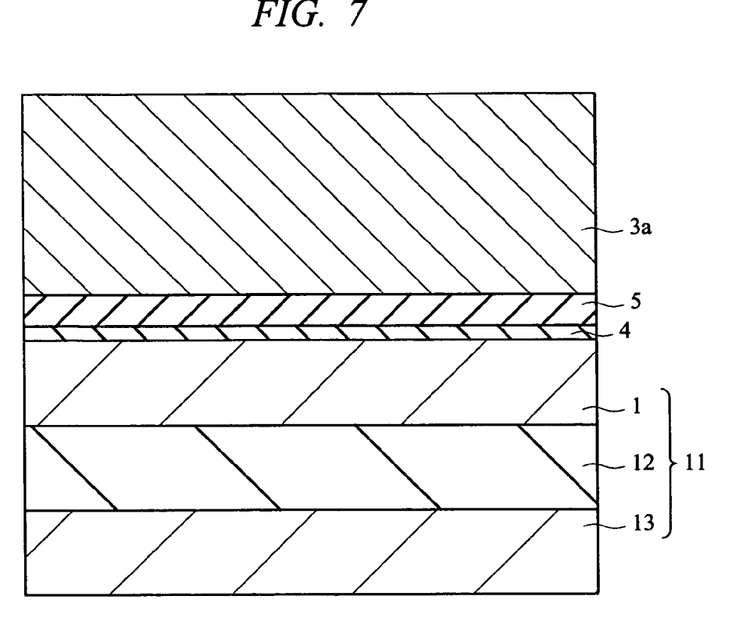
FIG. 7 is a schematic sectional view of main parts of a semiconductor device during a manufacturing process according to the Embodiment 1.

First, as shown in FIG. 7, the silicon substrate 11 having the supporting substrate 13, the buried oxide film 12, and the SOI layer 1 is prepared, and the silicon oxide film 4 is formed on the main surface of the silicon substrate 11, and the high-k film 5 is formed on the silicon oxide film 4. To form the silicon oxide film 4, for example, the surface of the silicon substrate 11 is thermally oxidized. To form the high-k film 5, for example, a film of $HfAlO_x$ as high-k film is deposited by ALD technique. The high-k film 5 may also be formed as an oxide containing hafnium such as $HfO_x$ or $HfSiO_x$ film.

Figure 8:
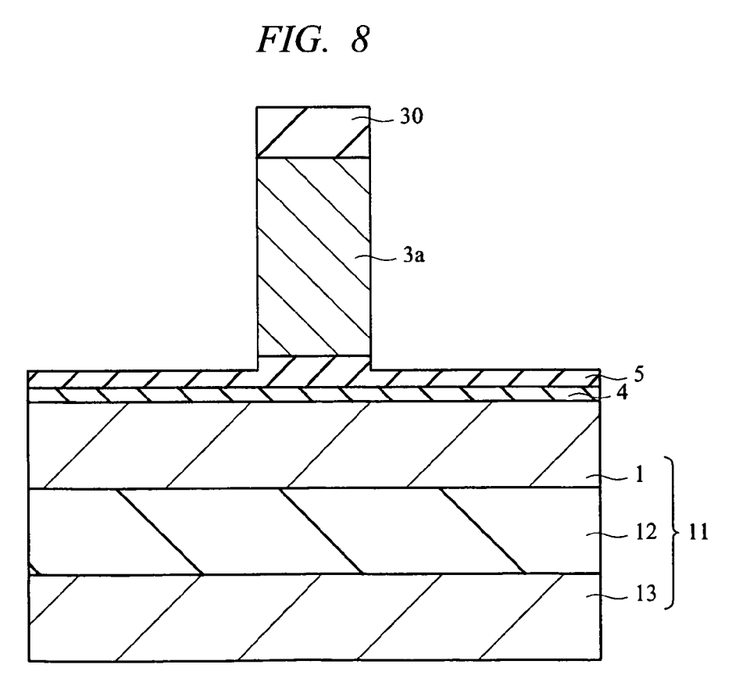
FIG. 8 is a schematic sectional view of main parts of the semiconductor device during a manufacturing process subsequent to FIG. 7.

Subsequently, a polycrystalline or amorphous silicon film 3a is formed on the high-k film 5, and, as shown in FIG. 8, the polycrystalline or amorphous silicon film 3a is selectively etched by using a mask 30 of photoresist mask or hard mask, and the surface of high-k film 5 is exposed. The polycrystalline or amorphous silicon film 3a can be adjusted even if the gate length is 10 nm or less. In FIG. 8, although the high-k film 5 is also etched, at least the surface of the high-k film 5 has only to be exposed.

Figure 9:
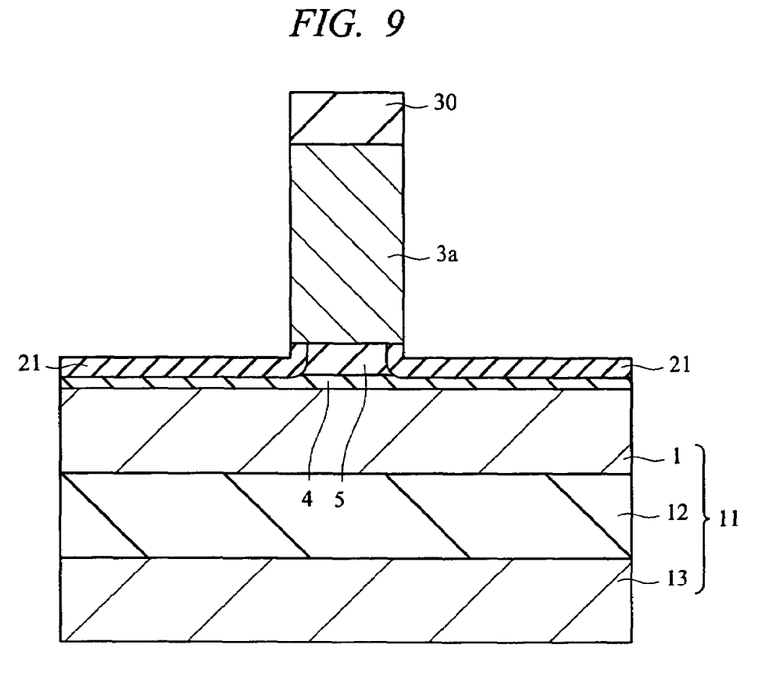
FIG. 9 is a schematic sectional view of main parts of the semiconductor device during a manufacturing process subsequent to FIG. 8.

Subsequently, as shown in FIG. 9, the nitrided region 21 is formed at least on the high-k film 5 beneath the polycrystalline or amorphous silicon film 3a. For example, in the case of the total physical film thickness of the high-k film 5 and the silicon oxide film 4 being about 1.5 nm to 2 nm, a depth of about 1 nm is nitrided from the exposed surface of the high-k film 5. Nitridation of depth of about 1 nm can be executed easily by low-temperature process. This nitridation process is realized, for example, by annealing process or plasma nitridation process in the atmosphere containing $N_2$, NO, $N_2O$, or $NH_3$. It must be noted that nitridation should not promote up to the SOI layer 1 so that adverse effects may not be applied to the MIS transistor characteristics by nitridation of SOI layer 1.

This nitridation process of the gate insulator 2 may also be executed in the etching apparatus as a process successive to selective etching of the polycrystalline or amorphous silicon film 3a as mentioned above.

Figure 10:
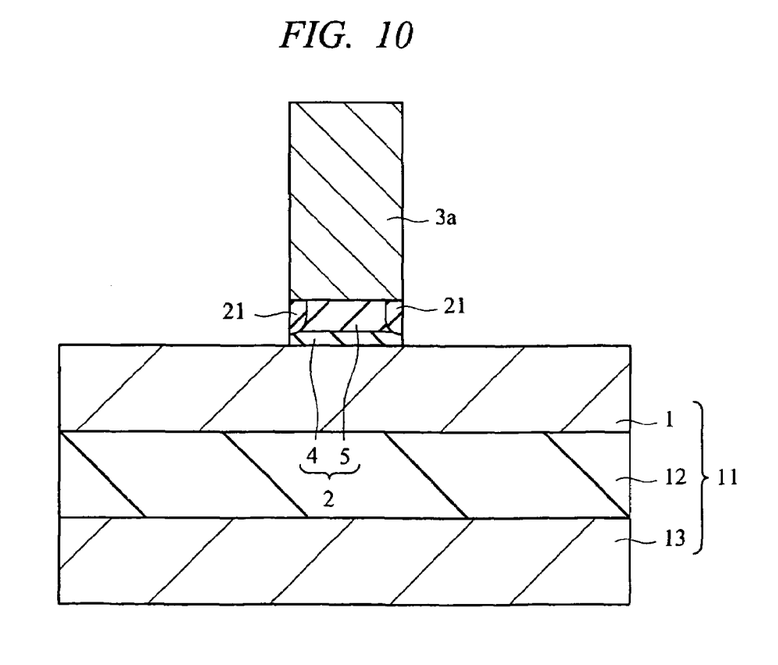
FIG. 10 is a schematic sectional view of main parts of the semiconductor device during a manufacturing process subsequent to FIG. 9.

Sequentially, by wet etching of exposed high-k film 5 and underneath silicon oxide film 4, as shown in FIG. 10, the gate insulator 2 comprised of the high-k film 5 and the silicon oxide film 4 is formed. As a result, the gate insulator 2 contains more nitrogen at the lateral side than at the central side in plane direction (gate length direction) of silicon substrate 11, and contains more nitrogen at the upper side than at the lower side in the film thickness direction.

Figure 11:
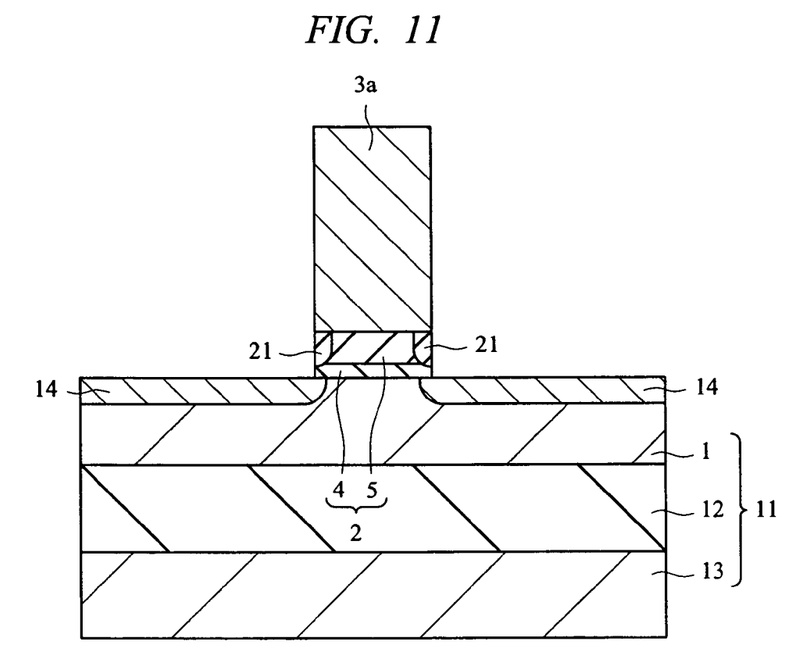
FIG. 11 is a schematic sectional view of main parts of the semiconductor device during a manufacturing process subsequent to FIG. 10.
Figure 12:
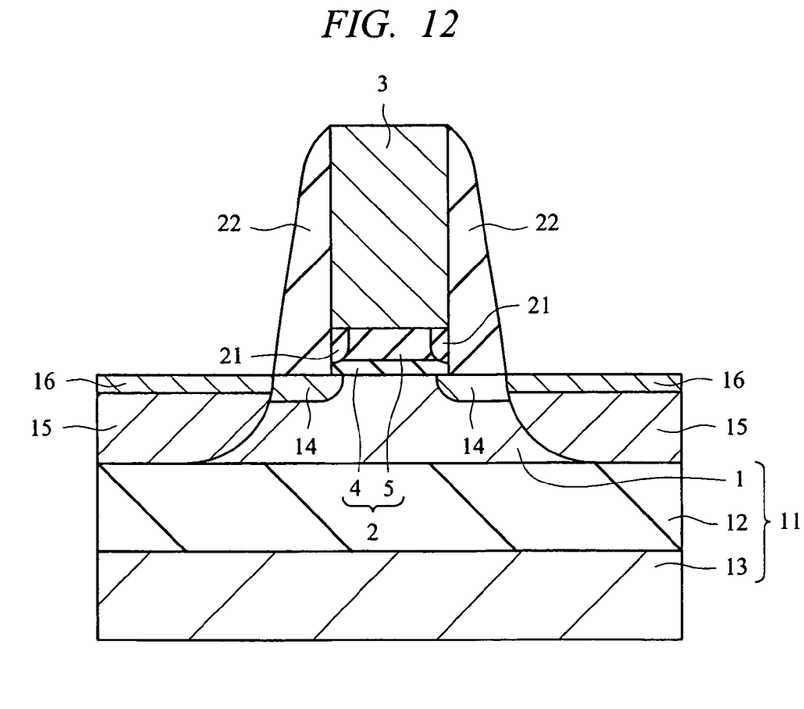
FIG. 12 is a schematic sectional view of main parts of the semiconductor device during a manufacturing process subsequent to FIG. 11.

As shown in FIG. 11, impurity ions are implanted into the SOI layer 1 to form a low-concentration semiconductor region 14, and, as shown in FIG. 12, a sidewall spacer 22 is formed on the sidewall of the polycrystalline or amorphous silicon film 3a. The sidewall spacer 22 is formed by depositing a silicon oxide film on the SOI layer 1 by CVD method, and etching this silicon oxide layer anisotropically. Further, impurity ions are implanted into the SOI layer 1, and the silicon substrate 11 is thermally treated, then the impurities are diffused, and thereby a high-concentration semiconductor region 15 is formed.

The surface of the polycrystalline or amorphous silicon film 3a and high-concentration semiconductor region 15 is silicided, and the gate electrode 3 and a silicide 16 are formed respectively. To form the gate electrode 3 and the silicide 16, for example, nickel (Ni) is deposited on the silicon substrate 11, and thermally treated to form nickel silicide (NiSi). By following these steps described above, a MIS transistor is formed.

On the silicon substrate 11, an interlayer insulator of silicon oxide film is deposited by CVD method, and a contact hole is formed in the upper part of the high-concentration semiconductor region 15. Then the contact hole is filled with tungsten plug, and a metal wiring layer electrically connected to, for example, other semiconductor layer is formed on the interlayer insulator and thereby a semiconductor device is obtained.

Embodiment 2

As an example of a semiconductor device of the present invention, an Embodiment 2 relates to a semiconductor device having a MIS transistor.

The semiconductor device in the Embodiment 2 of the present invention differs from the semiconductor device having the MIS transistor described in the Embodiment 1 only in the material applied to the high-k film. That is, in the Embodiment 1, the high-k film is made of oxide containing hafnium (Hf) such as $HfO_x$, $HfAlO_x$ or $HfSiO_x$, but in the Embodiment 2, a rare earth oxide is used such as $La_2O_3$ or $Y_2O_3$.

The semiconductor device in the Embodiment 2 comprises, as shown in FIG. 1, a gate insulator 2 having a silicon oxide film 4 formed on the silicon substrate 11, and a high-k film 5 formed on the silicon oxide film 4, and this gate insulator 2 includes a nitrided region 21. That is, in the MIS transistor of the Embodiment 2, more nitrogen is contained at the lateral side than at the central side in gate length direction, and more nitrogen is contained at the upper side than at the lower side in the film thickness direction.

In addition, in a manufacturing method of the semiconductor device of the Embodiment 2 includes a process of wet etching to form the gate insulator 2 in the manufacturing process transferring from FIG. 9 to FIG. 10.

For example, to realize an EOT of 0.5 nm or less, if using a rare earth oxide such as $La_2O_3$ or $Y_2O_3$ as high-k film, since the rare earth oxide is likely to absorb moisture, the reliability or characteristics of the MIS transistor may be lowered. Besides, because of moisture absorption, wet process is difficult to introduce.

However, by forming the nitrided region 21 in the gate insulator 2, moisture absorption of the rare earth oxide film can be decreased. Also by forming the nitrided region 21 in the gate insulator 2, the gate insulator 2 can be formed by wet etching in the manufacturing process transferring from FIG. 9 to FIG. 10.

Therefore, the reliability and characteristics of the MIS transistor using the gate insulator formed by high-k film made of rare earth oxide film can be enhanced.

Embodiment 3

As an example of a semiconductor device of the present invention, an Embodiment 3 relates to a semiconductor device having a FinFET employing a Fin structure in the channel of a MIS transistor.

An example of a manufacturing method of semiconductor device in the Embodiment 3 is explained with reference to FIG. 13 to FIG. 17. FIG. 13 to FIG. 17 are schematic perspective views of main parts of the semiconductor device in the manufacturing process of the Embodiment 3.

Figure 13:
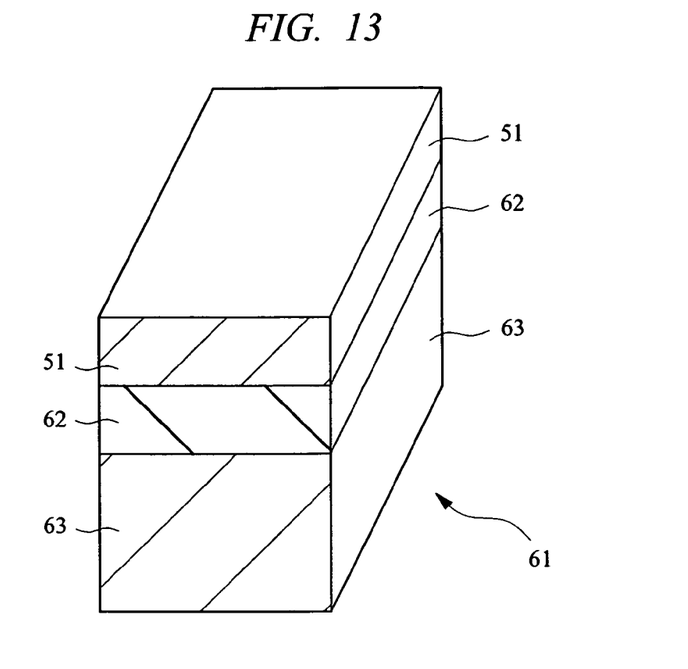
FIG. 13 is a schematic perspective view of main parts of a semiconductor device during a manufacturing process according to an Embodiment 3.

First, a silicon substrate 61 having a supporting substrate 63, a buried oxide film 62, and an SOI layer 51 as shown in FIG. 13 is prepared.

Figure 14:
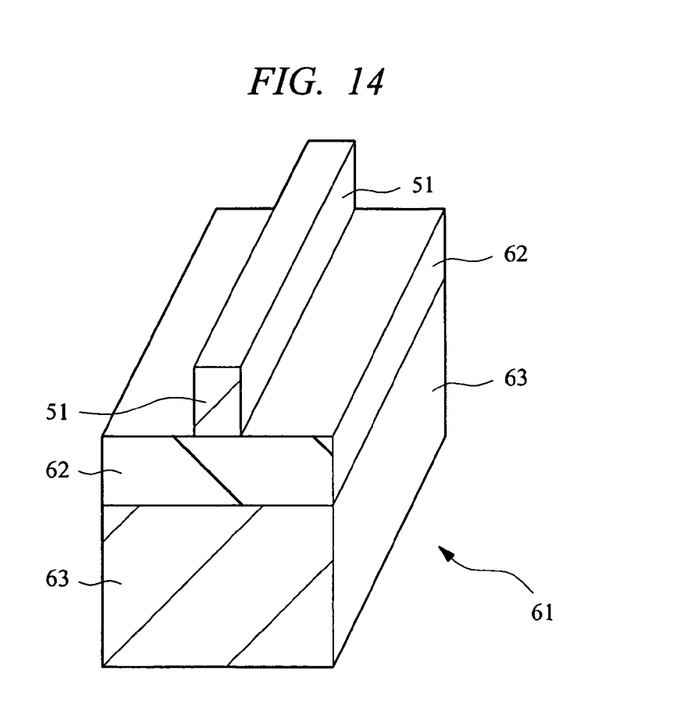
FIG. 14 is a schematic perspective view of main parts of the semiconductor device during a manufacturing process subsequent to FIG. 13.

Next, a Fin structure is processed as shown in FIG. 14. That is, the SOI layer 51 is etched selectively.

Figure 15:
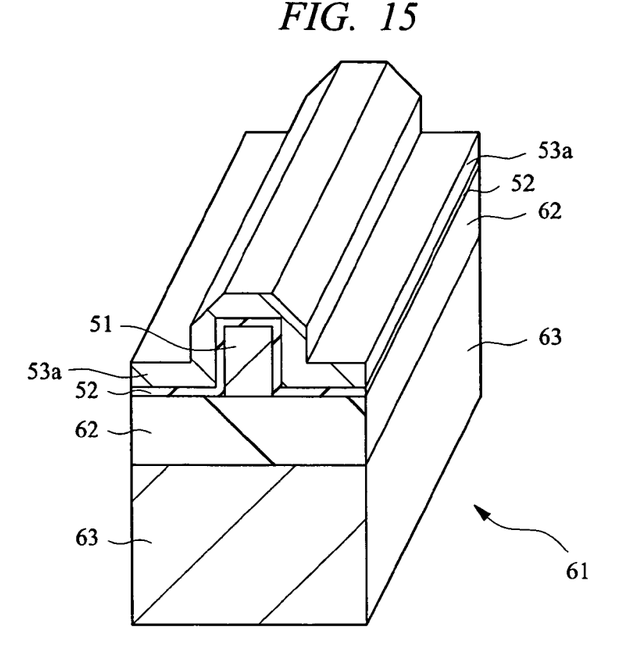
FIG. 15 is a schematic perspective view of main parts of the semiconductor device during a manufacturing process subsequent to FIG. 14.

As shown in FIG. 15, further, to cover the SOI layer 51, a gate insulator 52 is deposited on the surface of the silicon substrate 61, and a polycrystalline silicon, a amorphous silicon, or a conductive film 53a is deposited on the gate film 52. The gate insulator 52 has a stacked structure of a silicon oxide film and a high-k film on the silicon oxide film. The high-k film is formed by an oxide containing hafnium such as $HfO_x$, $HfAlO_x$, or $HfSiO_x$, and a rare earth oxide such as $La_2O_3$ or $Y_2O_3$.

Figure 16:
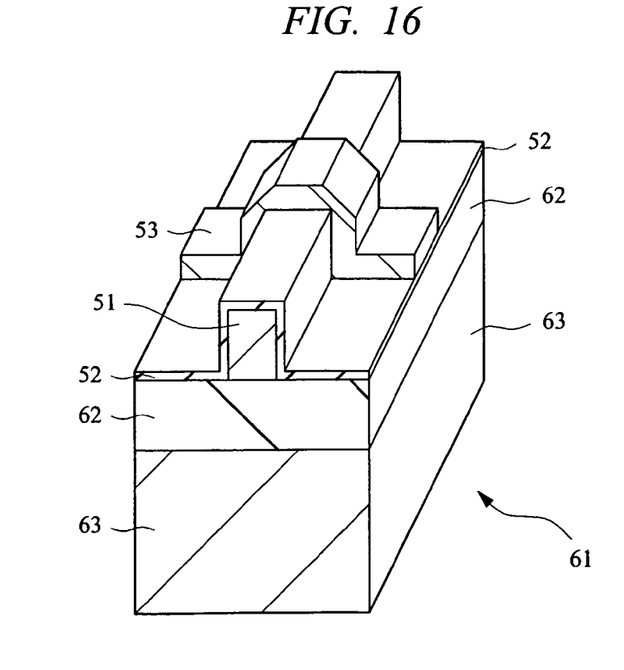
FIG. 16 is a schematic perspective view of main parts of the semiconductor device during a manufacturing process subsequent to FIG. 15.

Next, a gate is processed as shown in FIG. 16. That is, a gate electrode 53 is formed by selectively etching the polycrystalline silicon, amorphous silicon, or conductive film 53a.

Subsequently, a nitrided region is formed on the gate insulator 52 under the gate electrode 53. For example, if the thickness of the gate insulator 52 is about 1.5 to 2 nm, a depth of about 1 nm is nitrided from the exposed surface of high-k film. Nitridation of depth of about 1 nm can be executed by a low-temperature process. This nitridation process is realized by, for example, an annealing process or a plasma nitridation process in the atmosphere containing $N_2$, NO, $N_2O$, or $NH_3$. It must be noted that nitridation should not promote up to the SOI layer 1 so that adverse effects may not be applied to the FinFET characteristics by nitridation of the SOI layer 1.

Figure 17:
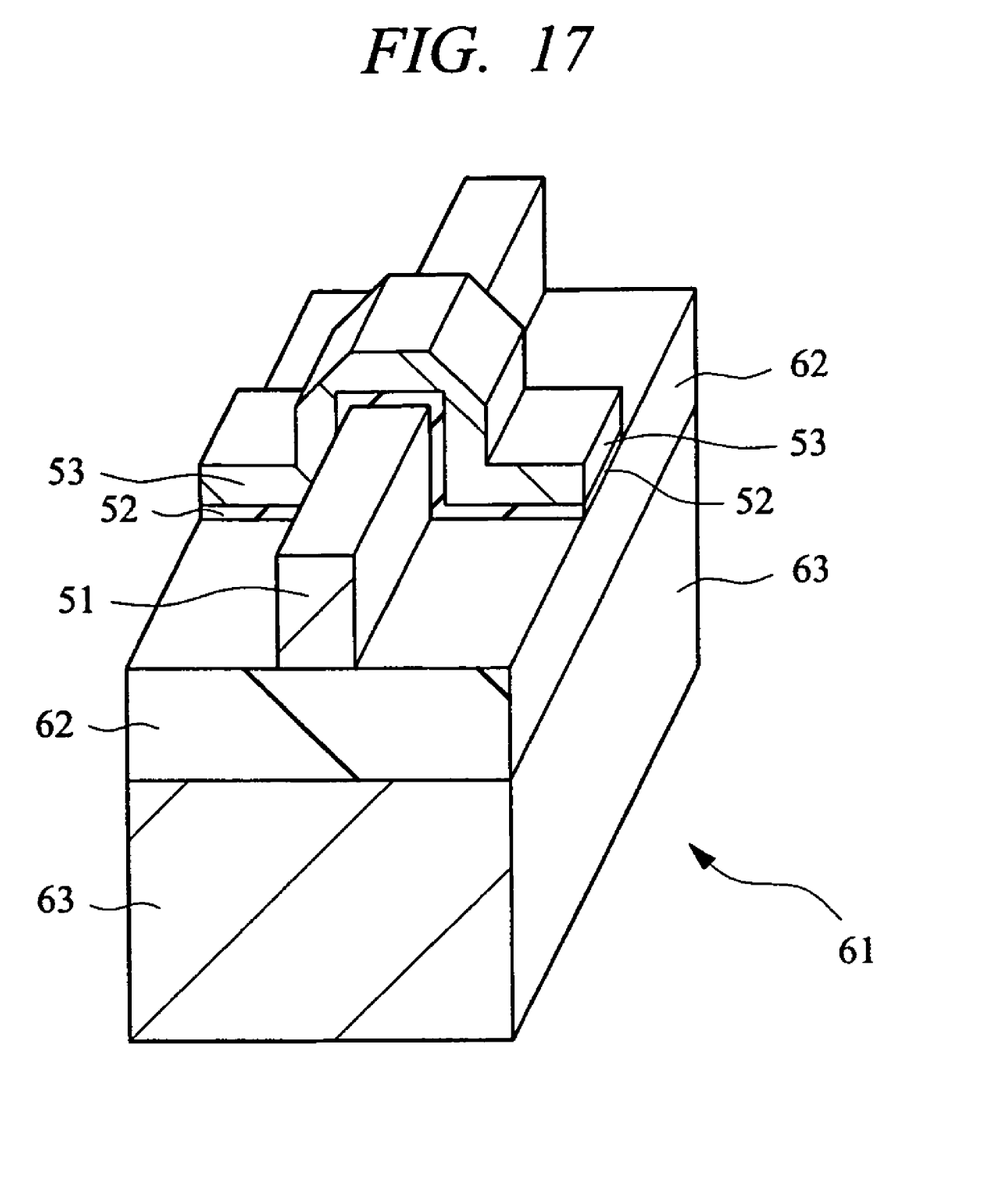
FIG. 17 is a schematic perspective view of main parts of the semiconductor device during a manufacturing process subsequent to FIG. 16.

Finally, as shown in FIG. 17, the exposed gate insulator 52 is removed by wet etching. By further ion implantation and activation, a FinFET is completed.

Thus, in the FinFET, since the channel formed of SOI layer 51 (Fin) is held by the gate electrodes 53 at both sides, a double gate structure is composed. By the double gate structure, the channel length is shortened, and the drain current characteristics can be enhanced.

By forming the channel in the Fin structure, short channel effects not depending on impurities can be suppressed. Further, impurity ion implantation is not needed for the SOI layer 51, and the MIS transistor characteristics are not deteriorated.

Still further, the oxygen diffusing in the manufacturing process is blocked by the nitrided region formed at the end (exposed end) of the gate insulator 52, formation of an oxide film between the high-k film and the gate electrode 53 can be prevented. That is, increase of EOT is suppressed without forming a process-induced oxide film.

Therefore, the present invention can enhance the reliability and characteristics of the MIS transistor using a gate insulator formed of a high-k material.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the foregoing embodiments are applied to the semiconductor substrate having the SOI layer on the buried oxide film as the semiconductor substrate to form the MIS transistor, but the present invention may also be applied to a semiconductor substrate made of bulk single-crystal silicon.

The invention is widely applied in the manufacturing industry for manufacturing semiconductor devices.

What is claimed is:

1. A semiconductor device comprising:
a silicon substrate,
a gate insulator including a high-k film formed on the silicon substrate, and
a MIS transistor having a gate electrode formed on the gate insulator,
wherein the gate insulator includes more nitrogen at the peripheral side than at the central side of the gate electrode in the gate-length direction of the gate electrode, and includes more nitrogen at the gate electrode side than at the silicon substrate side in the film thickness direction of the gate insulator.

2. The semiconductor device according to claim 1, wherein the silicon substrate side of the gate insulator has a region not including nitrogen.

3. The semiconductor device according to claim 1, wherein the high-k film contains an oxide of a rare earth element.

4. The semiconductor device according to claim 1, wherein the high-k film includes a hafnium oxide.

5. The semiconductor device according to claim 1, wherein the gate length of the gate electrode is 10 nm or less.

6. The semiconductor device according to claim 1, wherein the gate electrode is formed by a metal silicide or a metal.

7. The semiconductor device according to claim 1, wherein the silicon substrate has an SOI layer, and the channel of the MIS transistor is formed in the SOI layer.

8. A semiconductor device comprising:
a silicon substrate having a supporting substrate, buried oxide layer, and an SOI layer of a Fin structure,
a gate insulator including a silicon oxide film formed on the SOI layer and a high-k film formed on the silicon oxide film, and
a FinFET having a gate electrode formed on the gate insulator,
wherein the gate insulator includes more nitrogen at the peripheral side than at the central side of the gate electrode in the gate-length direction of the gate electrode, and contains more nitrogen at the gate electrode side than at the SOI layer side in the film thickness direction of the gate insulator.

* * * * *